United States Patent
Desai et al.

(10) Patent No.: US 10,831,941 B2
(45) Date of Patent: Nov. 10, 2020

(54) METHOD AND SYSTEM FOR AUTOMATING RESOURCE SELECTION AND BUILDING PLAN LAYOUT GENERATION

(71) Applicant: Aditazz, Inc., Brisbane, CA (US)

(72) Inventors: Sandeep Desai, Campbell, CA (US); Sudha Hajela, Brisbane, CA (US); Chuck Han, San Francisco, CA (US); Alexander Khainson, San Carlos, CA (US); Zigmund Rubel, Greenbrae, CA (US); Allen Goldberg, Soquel, CA (US)

(73) Assignee: Aditazz, Inc., Brisbane, CA (US)

( * ) Notice: Subject to any disclaimer, the term of this patent is extended or adjusted under 35 U.S.C. 154(b) by 394 days.

(21) Appl. No.: 15/725,087

(22) Filed: Oct. 4, 2017

(65) Prior Publication Data

US 2019/0102486 A1    Apr. 4, 2019

(51) Int. Cl.
*G06F 30/13* (2020.01)
*G06Q 50/06* (2012.01)
*G06Q 50/08* (2012.01)
*G06F 30/18* (2020.01)

(52) U.S. Cl.
CPC .............. *G06F 30/13* (2020.01); *G06F 30/18* (2020.01); *G06Q 50/06* (2013.01); *G06Q 50/08* (2013.01)

(58) Field of Classification Search
USPC ............................ 703/1, 2, 22, 24; 705/7.11
See application file for complete search history.

(56) References Cited

U.S. PATENT DOCUMENTS

| | | | |
|---|---|---|---|
| 9,607,110 B2 | 3/2017 | Vercruysse et al. | |
| 9,721,046 B2 | 8/2017 | Khainson et al. | |
| 2010/0235206 A1* | 9/2010 | Miller | E04D 3/352 705/7.11 |
| 2010/0238206 A1* | 9/2010 | Harris | B41J 2/17553 347/7 |
| 2010/0292976 A1* | 11/2010 | Newcombe | G06F 17/5004 703/13 |
| 2014/0222521 A1* | 8/2014 | Chait | G06Q 10/0637 705/7.36 |
| 2014/0222522 A1* | 8/2014 | Chait | G06Q 10/0637 705/7.36 |

(Continued)

OTHER PUBLICATIONS

U.S. Appl. No. 15/395,162, filed Dec. 30, 2016; 29 pages.

*Primary Examiner* — Thai Q Phan

(57) ABSTRACT

In an embodiment, a computer-based method for automatically selecting resources to include in a building plan layout is disclosed. The method involves obtaining a set of resource rules that define resources placeable within a building plan layout, obtaining a set of behavioral rules that define the behaviors of the resources, generating a model by evaluating the set of resource rules and the set of behavioral rules, obtaining a configuration, wherein a configuration comprises at least one of building demand, resource permutations, and other simulation attributes, generating at least one set of performance metrics by executing the model with the configuration, storing the at least one set of performance metrics, the model, and the configuration as an entry in a metrics database, selecting an entry from the metrics database, and outputting the entry to a building plan layout generator.

18 Claims, 11 Drawing Sheets

(56) References Cited

U.S. PATENT DOCUMENTS

| | | |
|---|---|---|
| 2014/0288890 A1 | 9/2014 | Khainson et al. |
| 2015/0317580 A1* | 11/2015 | Glissmann-Hochstein ................. G06Q 10/067 705/7.38 |
| 2017/0061039 A1 | 3/2017 | Sweeney et al. |
| 2017/0210377 A1 | 7/2017 | Bossdorf-Zimmer et al. |

* cited by examiner

METHOD AND SYSTEM FOR AUTOMATING RESOURCE SELECTION AND BUILDING PLAN LAYOUT GENERATION

BACKGROUND

Buildings are an integral part of our everyday lives. The steps followed to physically realize a building are very complicated and require a high degree of skilled labor that spans several different disciplines. The complexity and degree of skilled labor required becomes apparent when one tries to mathematically describe, model, simulate, optimize, and verify a building design because a complex combination of three-dimensional (3D) space and temporal operations may be required.

SUMMARY

In an embodiment, a computer-based method for automatically selecting resources to include in a building plan layout is disclosed. The method involves obtaining a set of resource rules that define resources placeable within a building plan layout, obtaining a set of behavioral rules that define the behaviors of the resources, generating a model by evaluating the set of resource rules and the set of behavioral rules, obtaining a configuration, wherein a configuration comprises at least one of building demand, resource permutations, and other simulation attributes, generating at least one set of performance metrics by executing the model with the configuration, storing the at least one generated set of performance metrics, the model, and the configuration as an entry in a metrics database, selecting an entry from the metrics database, and outputting the selected entry to a building plan layout generator.

In another embodiment, obtaining the set of resource rules comprises obtaining a set of rules that define at least resource characteristics regarding properties of individual resources.

In another embodiment, obtaining the set of behavioral rules comprises obtaining a set of rules that defines states of state-machines of at least one of resources and entities.

In another embodiment, generating a model comprises generating a plurality of models.

In another embodiment, generating at least one set of performance metrics further comprises executing one or more models in the plurality of models with the configuration.

In another embodiment, obtaining a configuration comprises obtaining a plurality of configurations.

In another embodiment, generating at least one set of performance metrics further comprises executing the model for one or more configurations in the plurality of configurations.

In another embodiment, selecting an entry from the metrics database comprises filtering entries in the metrics database that violate a resource rule.

In another embodiment, the method further involves generating a space program based on the selected entry, placing departments within the building plan layout based on the space program, placing rooms in the space program in the departments, placing content in the selected entry in the rooms, and outputting the building plan layout.

In another embodiment, placing is performed by a constraint solver.

In another embodiment, a computer-implemented system for automatically selecting resources to include in a building plan layout is disclosed. In the embodiment, the system is configured to obtain a set of rules that define resources placeable within a building plan layout, obtain a set of behavioral rules that define the behaviors of the resources, generate a model by evaluating the set of resource rules and the set of behavioral rules, obtain a configuration, wherein a configuration comprises at least one of building demand, resource permutations, and other simulation attributes, generate at least one set of performance metrics by executing the model with the configuration, store the at least one set of performance metrics, the model, and the configuration as an entry in a metrics database, select an entry from the metrics database, and output the entry to a building plan layout generator.

In another embodiment, the system is configured to obtain the set of resource rules by obtaining a set of rules that define at least resource characteristics regarding properties of individual resources.

In another embodiment, the system is configured to obtain the set of behavioral rules by obtaining a set of rules that defines states of state-machines of at least one of resources and entities.

In another embodiment, the system is configured to generate a plurality of models when generating a model.

In another embodiment, the system is further configured to generate at least one set of performance metrics by executing one or more models in the plurality of models with the configuration.

In another embodiment, the system is configured to obtain a configuration by obtaining a plurality of configurations.

In another embodiment, the system is further configured to generate at least one set of performance metrics by executing the model for one or more configurations in the plurality of configurations.

In another embodiment, the system is configured to select an entry from the metrics database by filtering entries in the metrics database that violate a resource rule.

In another embodiment, the system is further configured to generate a space program based on the selected entry, place departments within the building plan layout based on the space program, place rooms in the space program in the departments, place content in the selected entry in the rooms, and output the building plan layout.

In another embodiment, the system is configured to place the departments, rooms, and content using a constraint solver.

Other aspects and advantages of embodiments of the present invention will become apparent from the following detailed description taken in conjunction with the accompanying drawings.

BRIEF DESCRIPTION OF THE DRAWINGS

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

Reference throughout this specification to particular types of buildings are intended as exemplary language. Thus, references to specific components or elements of a building type may also refer more generally to a similar component or element of another building type.

Figure 1:
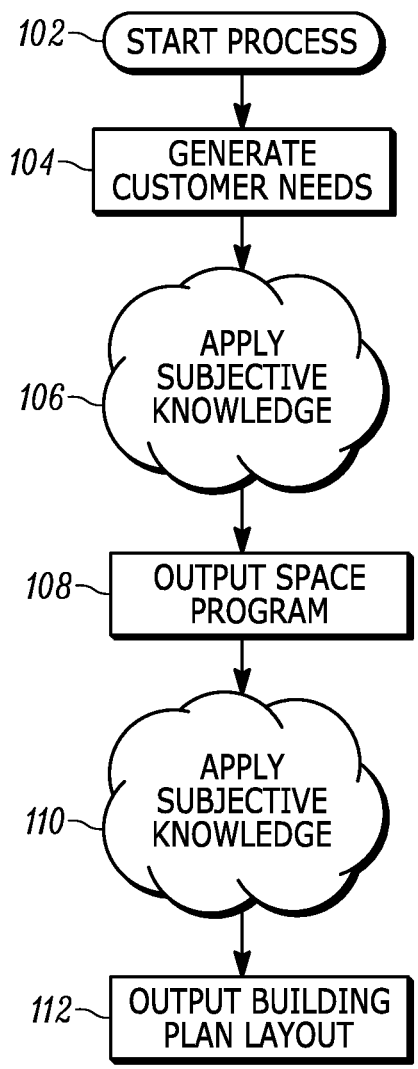
FIG. 1 is a flow chart diagram of a traditional approach for developing a building plan layout.
Figure 2:
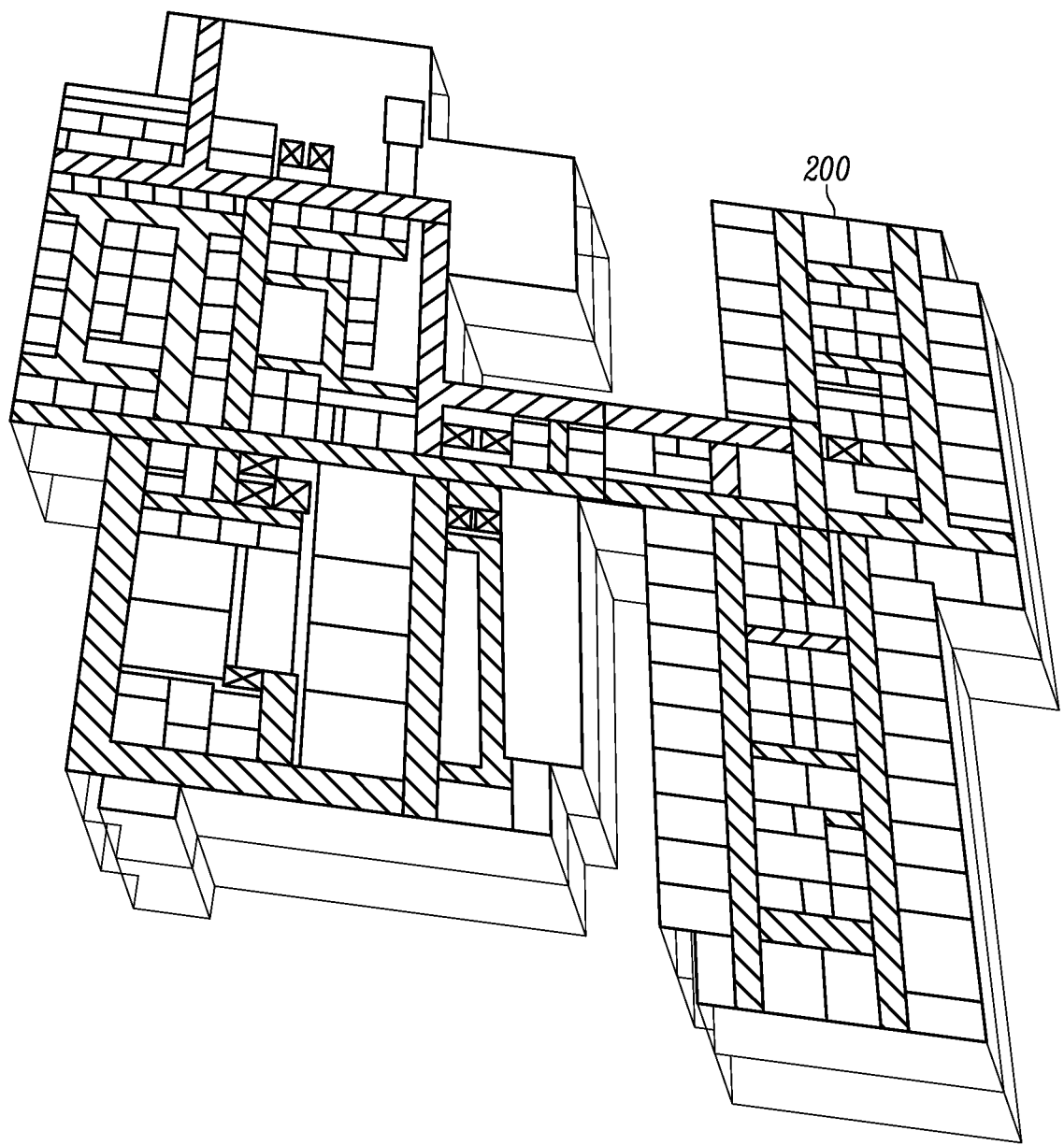
FIG. 2 is an illustration of an example of a building plan layout

FIG. 1 is a flow chart diagram of a traditional approach for developing a building plan layout. In an embodiment, a building plan layout is a 3D model, 2D layout, or textual description of the layout of a building having one or more stories. The building plan layout can include details about the layout of departments, rooms, and even content within the building. At starting point 102, an architect or building planner would be requested to develop a building plan layout for a building. At block 104, in order to complete this task, the architect would then speak with the building owners to establish the general needs of the building and generate a set of customer needs. For example, the architect would try to establish what the building would be used for, what the occupancy of the building is expected to be, or whether there are any preferences regarding, for example, building costs, operation costs, or possibility of future growth of the building. At phase 106, an architect applies subjective knowledge acquired from experience or the experience of others and, at block 108, outputs a space program. In an embodiment, a space program is a list that indicates department blocks to include in a building plan layout. Additionally, the space program can include the number of rooms to be included in each department block, the type of each room included, and dimensions (e.g., fixed or range) for each room included. At phase 110, the architect then applies further subjective knowledge to place the department blocks and rooms in the space program within a building shell to create a building plan layout. In an embodiment, a building shell indicates the outer X, Y, and Z dimensions of a building based on the footprint of the building. It may also indicate inner dimensions of one or more floors of the building, the placement of core building elements within the building, the placement of hallways and other circulation on the one or more floors, and areas where spaces or rooms can be placed on the one or more floors. At block 112, the architect masses one or more floor plan layouts to create a building plan layout (e.g., creates a three-dimensional, multi-storied model). FIG. 2 is an illustration of an example of a building plan layout As described with reference to FIG. 1, the traditional approach to developing a building plan layout relies heavily on subjective knowledge of the architect or building planner. Additionally, it requires the architect or building planner to be able to remember and accommodate all of the customer needs, while applying this subjective knowledge. Accordingly, if an inexperienced architect or building planner is being asked to develop a building plan, the resulting building plan layout may be of poor quality. However, even if an experienced architect or building planner is developing the building plan, because a human being is only able to remember a limited amount of data, customer needs may be neglected or forgotten and the resulting building plan layout still may be poor quality.

Alternatively, a computer-implemented system can be more suited to managing large amounts of data. Thus, customer needs would less likely to be neglected or forgotten during the process of developing a building plan layout. However, the computer-implemented system would be unable to utilize the subjective knowledge of an architect or a building planner when making decisions. Therefore, the computer-implemented system may make use of a different approach to developing a building plan layout.

Figure 3:
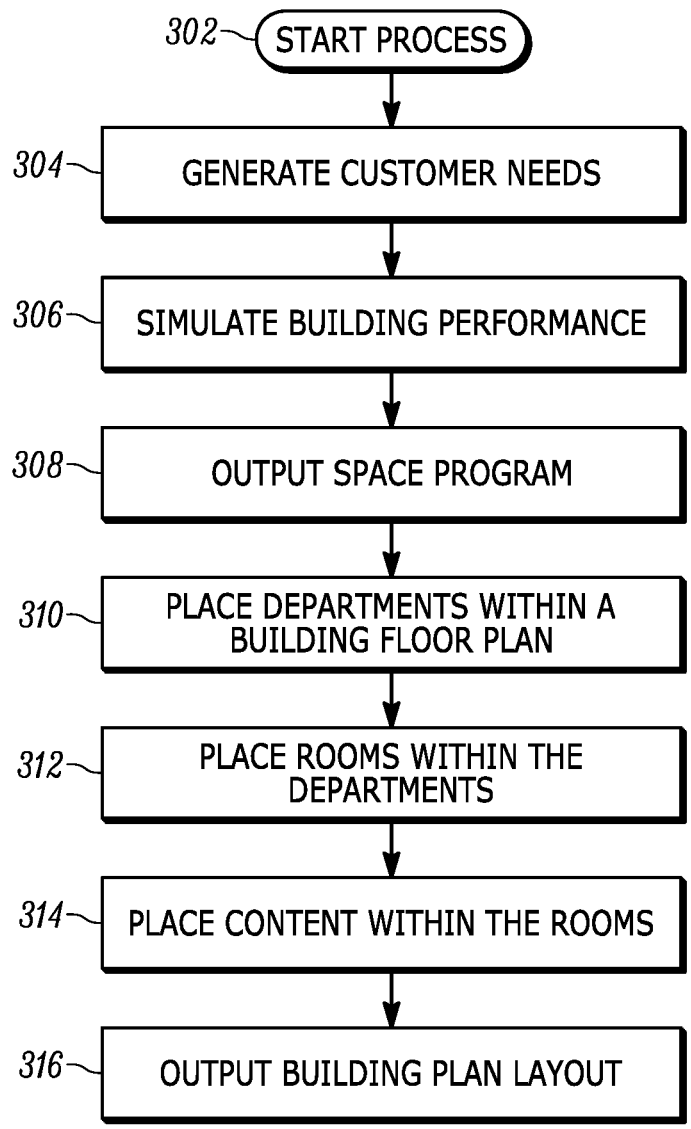
FIG. 3 is a flow chart diagram of a general approach to developing a building plan layout by a computer-implemented system.

For example, FIG. 3 is a flow chart diagram of a general approach to developing a building plan layout by a computer-implemented system. At starting point 302, a building owner would begin the process by accessing building planning software. At block 304, the building owner would be directed to enter the general needs of the building into a user-interface of the software. For example, the software would prompt the owner to indicate what the building would be used for, what the occupancy of the building is expected to be, or whether there are any preferences regarding, for example, building costs, operation costs, or possibility future growth of the building. The software may also prompt the owner to indicate upper and lower bounds for certain design metrics. For example, an owner may indicate that a building plan layout may not have more than ten floors and no less than four rooms or spaces of a particular type per floor. In an embodiment, a set of customer needs can be generated from entered general needs and can be stored as a list. The list can also include a goal or objective of the development process, which can be referred to as the "objective function." An example list of the set of customer needs for a hospital may include:

"Functions: x-ray, surgery, recovery, emergency, oncology, laboratory, . . .
  Patient Load: 50-150 patients
  Building Cost Maximum: 300,000,000
  Operating Budget: 95,000,000
  Future growth: true
  Maximum Height: 5 stories
  Optimization Goal: Satisfy Quality of Service at Lowest Cost"

At block 306, a simulator simulates operation of the building and a space program is generated based on performance results.

At block 308, a space program with the most optimal results, as defined by the building owner's preferences, is output to, for example, a user or to a building realization platform ("BRP") as described in U.S. Pat. No. 9,607,110, entitled "SYSTEM AND METHOD FOR REALIZING A BUILDING SYSTEM."

At block 310, a department placer tool would place departments within a building plan layout. In an embodiment, a department placer tool can be implemented in software and uses adjacency tables to evaluate a cost algorithm to place departments throughout a building shell. The department placer tool is described in further detail in U.S. Pat. No. 9,721,046, entitled "SYSTEM AND METHOD FOR REALIZING A BUILDING SYSTEM THAT INVOLVES COMPUTER BASED MATCHING OF FORM TO FUNCTION."

At block 312, a room placer tool would place rooms or spaces within the departments. In an embodiment, the room placer tool can be implemented in software using a constraint solver to place rooms within a building plan layout. The room placer tool is described in further detail in U.S. patent application Ser. No. 15/395,162, METHOD AND SYSTEM FOR AUTOMATICALLY GENERATING AN INTERIOR TESTFIT FOR A BUILDING.

At block 314, a content placer tool would place content within the rooms or spaces. In an embodiment, the content placer tool can be implemented in software using a constraint solver to place objects or contents within rooms throughout a building plan layout. The content placer tool is described in further detail in U.S. Pat. Pub. No. 2017/0061039, entitled COMPUTER-IMPLEMENTED SYSTEM AND METHOD FOR PLACING OBJECTS IN A ROOM.

In an embodiment, the departments, room or spaces, and content would be dictated by the space program. Furthermore, the department placer tool, room placer tool, and content placer tool may each be configured to select an optimal placement as defined according to the building owner's preferences. Finally, at block 316, a building plan layout can be output. In an embodiment, the building plan layout can be output as computer code, as a text file, or as a graphical file. Accordingly, because each step may be configured based on the preferences of the building owner, the output building plan layout may also be the optimal building plan layout given the building owner's needs.

In accordance with an embodiment of the invention, the approach described with reference to FIG. 3 can be implemented by computer-implemented operations that perform a method of automatically selecting resources to include in a building plan layout. In an embodiment, a computer-based method for automatically selecting resources to include in a building plan layout is disclosed. The method involves obtaining a set of resource rules that define resources placeable within a building plan layout, obtaining a set of behavioral rules that define the behaviors of the resources, generating a model by evaluating the set of resource rules and the set of behavioral rules, obtaining a configuration, wherein a configuration comprises at least one of building demand, resource permutations, and other simulation attributes, generating at least one set of performance metrics by executing the model with the configuration, storing the at least one set of performance metrics, the model, and the configuration as an entry in a metrics database, selecting an entry from the metrics database, and outputting the entry to a building plan layout generator. Thus, a computer-implemented system can be configured by replacing subjective determinations made by architects or building designers with rules that define sets of resources and rules that define behaviors of resources in the set of resources. Additionally, as a computer-implemented system, the set of customer needs may not be neglected or forgotten. Accordingly, the approach for generating building plan layouts can be improved by incorporating rules in a computer-implemented system to automatically produce a building plan layout.

Computer-Implemented System

Figure 4:
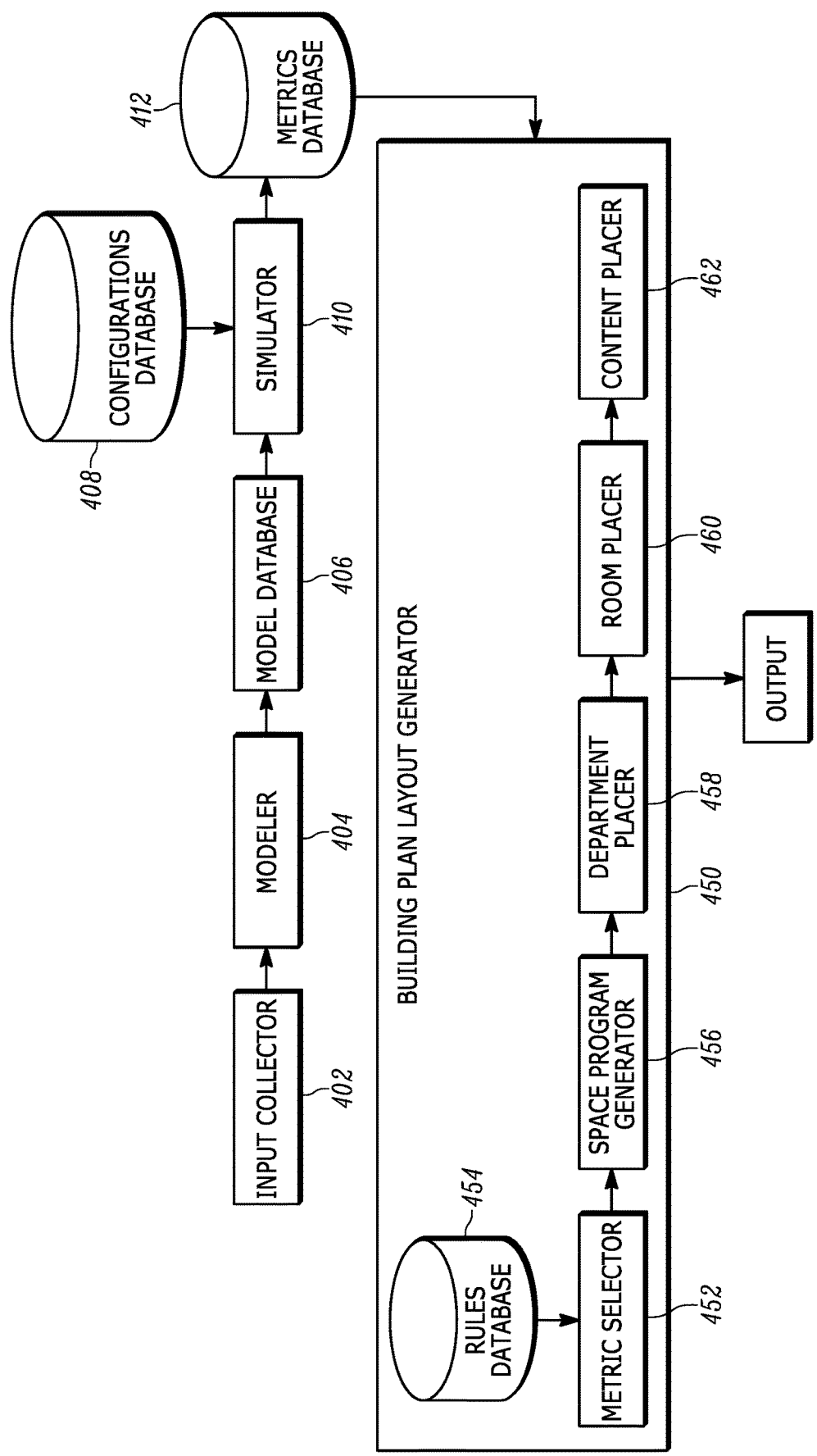
FIG. 4 is an embodiment of the computer-implemented system in accordance with an embodiment of the invention.

FIG. 4 is an embodiment of the computer-implemented system in accordance with an embodiment of the invention. In the embodiment, the system includes an input collector 402, a modeler 404, a model database 406, a simulator 410, a configurations database 408, a metrics database 412, and a building plan layout generator 450. In the embodiment, the building plan layout generator includes a metric selector 452, a rules database 454, a space program generator 456, a department placer 458, a room placer 460, and a content placer 462.

In an embodiment, the input collector is configured to receive information such as a set of resource rules that define resources to be placed within a building plan, a set of behavioral rules, and other attributes in order to generate a model (e.g., operational schedules, resource distribution, etc.). In an embodiment, the resource rules, behavioral rules, and a default set of other attributes can be received as a base library file.

In an embodiment, resource rules can be created by using a human-readable data serialization language, such as .yaml, to define resource characteristics regarding properties of individual resources. For example, resource rules can define the dimensions of a particular resource, the cost of a particular resource, the number of possible concurrent users of the resource, or the number of instances of a given resource to be included in a model. Resource rules can also define inter-resource relations and can be used to filter simulation results as described below.

Behavioral rules can also be created by using a human-readable data serialization language to describe states of a state-machine for a given resource as well as for other entities in the model. In an embodiment, a state-machine is program or a class defining a set number of conditions or states and transitions between those conditions or states. State-machines can be implemented using, for example, one or more arrays.

In an embodiment, the modeler 404 is configured to consume the resource rules, the behavioral rules (e.g., yaml files), and other attributes to create an executable model. In an embodiment, the other attributes can also be created by using a human-readable data serialization language to define an activity. For example, an x-ray procedure activity may be defined as:

name: xrayProcedure
  entities:
    patient
    radiologyTechResource
    xrayEquipmentResource
  durationDistribution: uniform5To10Minutes
  waitAreas:
    entity: patient
    name: xrayProcedure_radiologyWaitArea
  actionOnStart: Patient patient=(Patient)
  activityInstance.findEntitiesWithRoleName("patient")
    .get(0);
  activityInstance.duration=
  patient.appointmentDurationOverride(patient.currentAppointment);

wherein the entities field indicates the entities involved in the activity, the durationDistribution field indicates a rate at which the activity is performed in a model, the waitAreas field indicates what wait behavior is performed by which entities, and the actionOnStart field indicates procedural code to be executed upon the start of the activity.

In an embodiment, the modeler 404 can be configured to generate Java class files aggregated as a Java Archive (JAR) package. The modeler can be implemented similar to a compiler used with programming languages. The resource rules, behavioral rules, and other attributes can be fed into a parser and translated into Java class files by a model generator using various libraries to produce the executable model. In an embodiment, the various libraries may include a discrete event simulations library (e.g., DESMO-J), a domain simulation library, or a class library.

In an embodiment, once the modeler 404 has generated the model, the model can be stored within the model database. In an embodiment, a single mode model is created and stored at a time, but, in other embodiments, additional models can be generated and stored concurrently. Additional models can be generated by changing the resource rules, behavioral rules, and/or other attributes before re-generating the model.

In an embodiment, the simulator can be configured to select a model from the model database, to receive a configuration from the configuration database, and to execute the model using the received configuration.

In an embodiment, a configuration can include arguments that can be passed to a model when the model is executed by the simulator. A configuration can include a care plan (e.g., hospital patient demand or customer demand), permutations (e.g., how many instances of each resource to include), or additional override information that can override Java classes in the model. For example, if a base library file is received as input, then a configuration can include additional override information that defines additional resources not included in the base library file.

In regards to a care plan, the configuration can include a care plan that defines a number and type of patients to be serviced during the simulation. In an embodiment, the patients can be generated by generators using healthcare data drawn from reports on the health needs of the community in which the hospital is to be built.

In regards to permutations, the resource distribution received by the input collector can be overridden by a configuration. In an embodiment, permutations are generated by a permuter (not shown) configured to generate permutations given a set of resources and associated resource level ranges to be included in the simulation. The set of resources can be determined based on customer needs.

In an embodiment, the simulator 410 can be configured to execute a model and to reference attributes of the configuration in order to simulate the interaction of entities within the model given a set of behavioral rules. The simulator can be a software application executing in a computer system that utilizes computer system resources. In an embodiment, the interaction of entities given a set of behavioral rules is simulated by synchronously transitioning the entities through their associated behaviors as described below with reference to FIG. 8.

In an embodiment, the simulator 410 can be configured to generate performance metrics for the set of resources and to store the generated performance metrics in the metrics database 412. In an embodiment, each entry in the metrics database includes the generated performance metrics and the set of resources used in the simulation to generate those performance metrics. Performance metrics may include, for example, the rate at which behaviors can be performed using the resources in the model (e.g., throughput), the amount of time spent active versus waiting for each resource, or the variation in the amount of time similar profiles complete similar behaviors.

Once a number of simulations have been run and a number of entries have been stored in the metrics database 412, the metrics database can be accessed by the building plan layout generator 450 to generate a building plan layout. In an embodiment, a building plan layout generator includes a metric selector, a space program generator, a department placer, a room placer, and a content placer.

In an embodiment, a metric selector 452 is configured to filter entries in the metrics database 412 using resource rules. For example, if a resource rule requires that all beds be placed in pairs, then the metric selector can filter all entries from the metrics database where the set of resources includes an odd number of beds (e.g., an entry which would violate the resource rule requiring all beds to be placed in pairs).

Once the metric selector 452 has filtered the entries in the metrics database 412 using the resource rules, a single entry can be selected and the set of resources associated with an entry can be passed to the space program generator 456.

In an embodiment, the space program generator 456 can be configured to receive the set of resources and to generate a space program. In an embodiment, a space program is a list that indicates department blocks to include in a building plan layout. Additionally, the space program can include the number of rooms to be included in each department block, the type of each room included, and dimensions (e.g., fixed or range) for each room included. For example, if a building plan layout for a hospital is being generated, then the space program may contain the number of rooms allocated to beds, the number of rooms allocated to surgery, the number of rooms allocated for patient waiting, etc.

In an embodiment, the department placer 458 receives the generated space program and places departments in a building plan layout to generate a department plan. In an embodiment, a department placer tool can be implemented in software and uses adjacency tables to evaluate a cost algorithm to place departments throughout a building shell. The department placer tool can also be configured to use travel frequencies in the selected metrics to determine costs for department placements. For example, if the model generates metrics that indicate a high number of travels between two departments, the department placer tool can use those metrics to determine that the two departments should be placed in close proximity.

In an embodiment, the room placer 460 receives the department plan and the space program and places the rooms in the space program within the various departments of the department plan to generate a room plan. In an embodiment, the room placer tool can be implemented in software using a constraint solver to place rooms within a building plan layout.

In an embodiment, the content placer 462 places resources from the simulation records in the rooms of the room plan to generate a building plan layout. In an embodiment, a building plan layout can be repeated for each floor of a building or two or more building plan layouts can be generated and stacked until the stacked building plan layouts satisfy the received set of customer needs.

Automatic Building Plan Layout Generation

Figure 5:
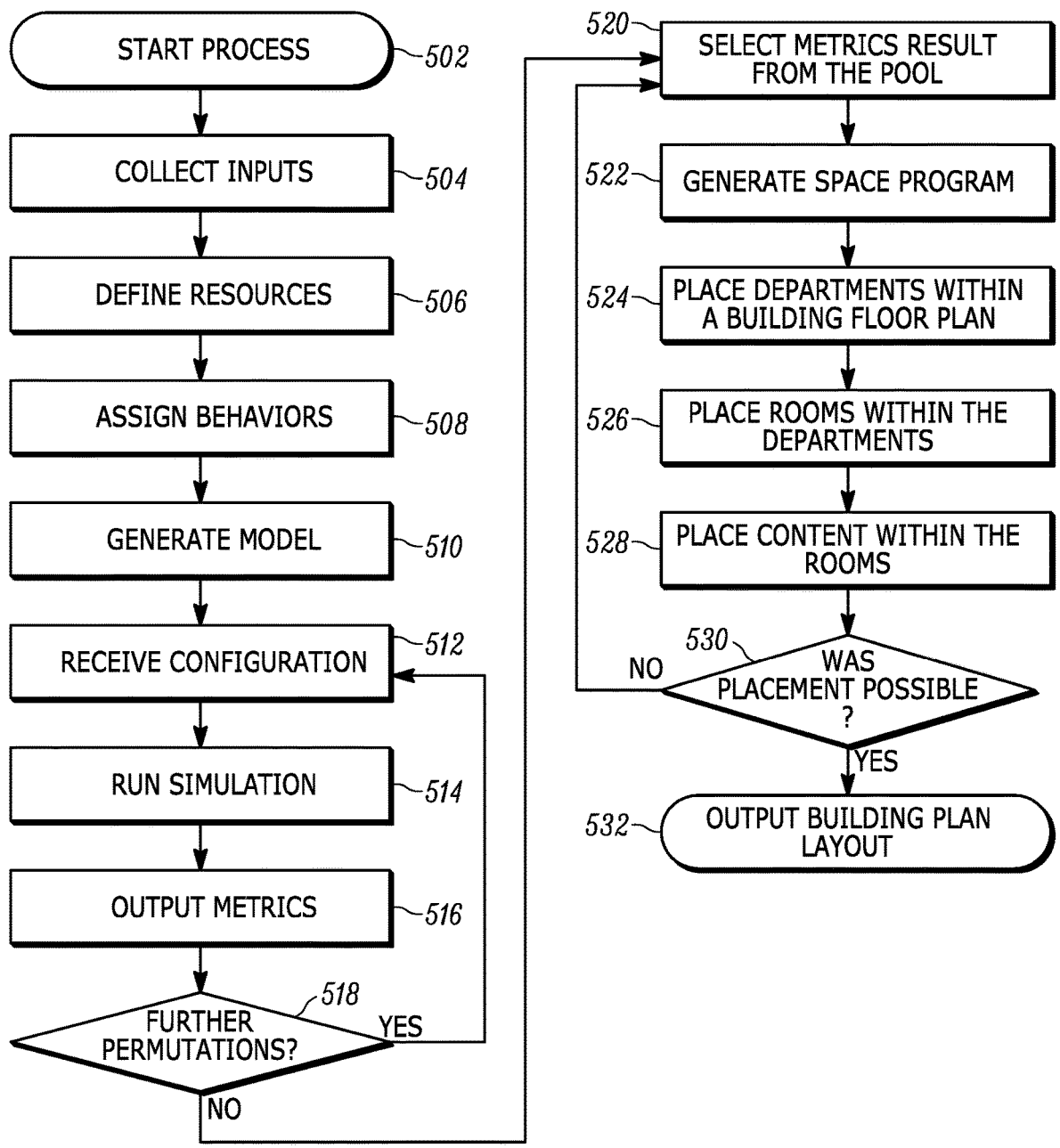
FIG. 5 is a flow chart diagram of a method for automatically generating a building plan layout in accordance with an embodiment of the invention.

FIG. 5 is a flow chart diagram of a method for automatically generating a building plan layout in accordance with an embodiment of the invention. Similar to FIG. 3, in FIG. 5, at starting point 502, a building owner would start the process by accessing building planning software.

At block 504, the software would collect various inputs. For example, inputs may include resource rules, behavioral rules, or other attributes used to generate a model (e.g., operational schedules, resource distribution, etc.) as described above.

At block 506, resources that can be included in the building plan layout are defined from the resource rules. For example, an x-ray machine resource can be defined using a resource rule for an x-ray machine.

At block 508, behaviors, as defined by behavioral rules, are assigned to the resources defined at block 506. In an embodiment, behaviors are assigned based on the type of the resource. For example, a behavior for a patient receiving an x-ray can be assigned to an x-ray type patient. Accordingly, during simulation, the assigned behavior can be performed, as described with reference to FIG. 6 below. In another example, a behavior defined by an x-ray machine behavioral rule can be assigned to an x-ray machine resource, as described with reference to FIG. 7 below.

Figure 6:
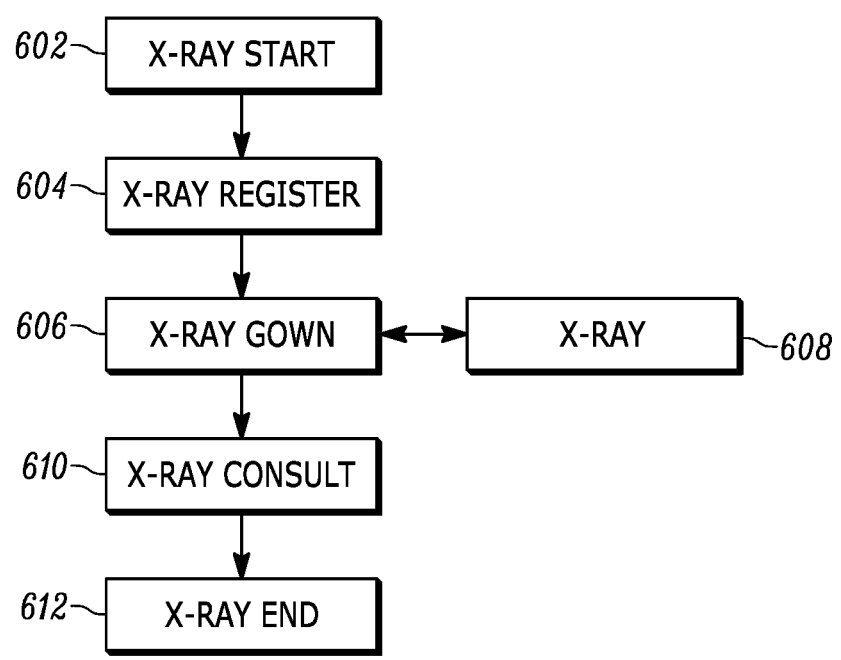
FIG. 6 is a flow chart diagram of a behavior for a patient receiving an x-ray

In an embodiment, behaviors can be state-machines implemented in software with actions, transitions, and transition conditions for performing a specific function. For example, FIG. 6 is a flow chart diagram of a behavior for a patient receiving an x-ray. In an embodiment, the behavior would be one of many behaviors assigned to a patient profile. At block 602, a patient begins the x-ray function (e.g., the initial state of the state-machine). At block 604, the state-machine transitions and the patient registers for the x-ray. In response to the completion of registration, the state-machine transitions to block 606 and the patient enters a dressing area to gown. When the patient is gowned, the state-machine transitions to block 608 and the patient enters the x-ray room and the x-ray is performed. Once the x-ray is performed, the state-machine transitions back to block 606, but, because the patient is already gowned, the patient disgowns. Once the patient has disgowned at block 610, the state-machine transitions to block 612 and the patient receives an x-ray consultation. Upon completion of the x-ray consultation, the state-machine transitions to its final state at block 612.

Figure 7:
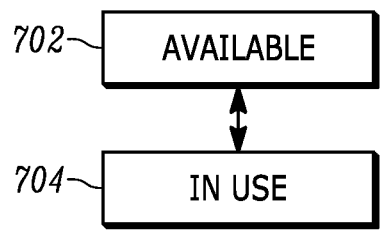
FIG. 7 is a flow chart diagram of a resource profile for an x-ray machine.

In an embodiment, resource behaviors can also be implemented as state-machines with actions, transitions, and transition conditions for performing a specific function, but with more limited states. For example, FIG. 7 is a flow chart diagram of a behavior for an x-ray machine. At block 702, when no x-ray is being performed, the x-ray machine is in the available state. When an x-ray is being performed, the state of the x-ray machine transitions to block 704 and the x-ray machine enters the in-use state. When the x-ray is finished, the state of the x-ray machine transitions back to block 702 and the x-ray machine re-enters the available state.

In other embodiments, additional states can be added to the state-machines to enable schedules (e.g. an "offline" state).

Returning to FIG. 5, at block 510, a model is generated. In an embodiment, the inputs received, the defined resources, and the assigned or defined behaviors are compiled into an executable model as described above. The model can then be stored in a model database, while additional models may be generated from different inputs and rules. Alternatively, the technique can continue on to simulate the model.

At block 512, before the simulation is run, the simulator receives a configuration, as described above. Then, at block 514, the simulation can be run. In an embodiment, a simulation is run by executing a model (e.g., a model selected from the model database), which takes the configuration as input during execution (e.g., as an argument passed to a model when executed). At block 516, the metric results of the simulation can be output by the simulator. The metric results are a set of performance metrics can be stored as an entry in a metrics database. In an embodiment, the entry also includes the model and resources used by the simulator to generate the set of performance metrics.

At decision point 518, if additional permutations (e.g., variations on the resources used by the simulator) remain, then the process can return to block 512. If additional models remain in the model database, then the process can also return to block 512, but a different model can be selected.

In an embodiment, only a subset of all total possible permutations and models are simulated. The subset of possible permutations and models can be limited to a set of simulations that are most likely to satisfy client demand. For example, a permutation with only one bed in a hospital will likely not satisfy client demand and so the permutation need not be simulated.

At block 520, an entry is selected from the metrics database. In an embodiment, the entries stored in the metrics database are queried based on an attribute corresponding to a user-defined performance level. For example, a user can specify a low wait-time performance level and so the metrics database will be queried for the entry with the lowest wait-time metric.

At block 522, a space program is generated based on the set of resources associated with the selected entry. As described with reference to FIG. 1, a space program may be a list that indicates department blocks to include in a building plan layout. Additionally, the space program can include the number of rooms to be included in each department block, the type of each room included, and dimensions (e.g., fixed or range) for each room included. Thus, a space program is generated based on the set of resources associated with the selected entry by using a constraint solver to generate a set of departments and/or rooms that will accommodate all of the resources in the set of resources and will fit within the dimensions of the building.

At block 524, departments can be placed within a building floor plan, and at block 526, the rooms in the generated space program can be placed within the departments. In an embodiment, a department is a logical grouping of rooms or areas in which an associated function is performed. For example, in a hospital, an x-ray department can be defined as a group of rooms including waiting rooms, administrative areas, changing rooms, and procedure rooms. In a hotel, a conference department can be defined as a group of rooms including display halls, meeting rooms, and catering staging areas. In an embodiment, the rooms can be placed within departments using a constraint solver.

At block 528, content can be placed within the rooms placed at block 526. In an embodiment, the content is selected from the set of resources. For example, the set of resources for a hospital may include beds, sinks, mirrors, chairs, etc. These resources can be placed within rooms as content by a content placer. In an embodiment, the content placer can be implemented using a constraint solver.

At block 530, it is determined if placement at blocks 522, 524, 526, and 528 was possible. If not, the process returns to block 520 and a different entry is selected and the process repeats. In an embodiment, a check can also be performed after each block and if placement fails at any block, as determined by each placer, then the process can return to block 520.

If placement was possible at each block, then, at block 532, the building plan layout is output to a user. In an alternative embodiment, the building plan layout can be output to another computer-implemented system in the building realization platform for further operations.

Thus, by incorporating rules into a computer-implemented system, a building plan layout can be automatically generated. Additionally, by automating the generation of a building plan layout, customer needs will likely be more completely satisfied. Furthermore, if a customer decides to make changes to the needs of the building or wishes to change the optimization goal of the building (e.g., minimize staff instead of minimize cost), a new building plan layout can be automatically generated that satisfies the changed needs or optimization goal without great effort by an architect or building planner. In further embodiment, the performance metrics can be further utilized in conjunction with the building plan layout to optimize the performance of operations or processes within the building (e.g., the protocols or steps for providing services, or the routes patients should take between departments.)

Simulator Implementation

As introduced with respect to block 514 in FIG. 5, building activity is simulated by a simulator that executes a model using a configuration to generate metrics for a set of resources defined by the configuration.

Typically, a simulator can be used as an alternative to mathematical modeling of a system when a finite number of states is too great to be practically calculated for the system. A finite number of states is too great to be practically calculated when the system is defined by a large set of parameters and initial conditions that cause the behavior of the system to change over the simulation. For example, a simulator can be used to determine metrics related to the interaction of stimuli with resources. For example, if a hospital is being modeled, then a simulator can be used to determine information such as cost, throughput, and usage given resources to be included in the hospital, hospital staff, and patients to be serviced by the hospital.

An approach used in computer simulation is to define each resource and stimulus as a state-machine. For example, as described above with reference to FIG. 6, the process of a patient receiving an x-ray can be defined by a state-machine with a state for each step of the x-ray process. Alternatively, as described above with reference to FIG. 7, the state of an x-ray machine can also be defined with a state-machine that is limited to either an available state or an in-use state.

An integral part of computer simulation is the internal coordination of the various defined state-machines. For example, in order for the simulation to be accurate, the state-machine of the patient receiving an x-ray can only transition through all of its states in coordination with the x-ray machine's transitions through its states. That is, the patient state-machine will enter the "x-ray" state, but will remain in the "x-ray" state until the x-ray machine enters the "available" state and the x-ray activity can start.

In accordance with an embodiment of the invention, the various defined state-machines are coordinated by a self-coordinating discrete event simulator. In an embodiment, the discrete event simulator includes a model having at least one activity instance, wherein the at least one activity has an activity type that defines a participating entity type list and a duration of time over which the activity instance will be performed, at least one activity queue, wherein the at least one activity queue is configured to hold the at least one activity instance in an order, and at least one entity, wherein the at least one entity is associated with at least one behavior and is configured to join at least one activity instance, and a configuration, wherein the configuration further defines the at least one entity, wherein the at least one entity is configured to perform the at least one associated behavior when, upon joining the at least one activity instance, an entity for each type in the participating entity type list of the activity instance has joined the activity instance. That is, entities can be synchronized by synchronously triggering the performance of entities' respective behaviors once all entities needed, as defined by an activity type, have joined an instance of the activity.

Thus, the coordination of the various defined state-machines can be performed without a need for an external control (e.g., from a centralized resource scheduler or a similar central controller within a simulator) and, thus, computational overhead typically allocated to external control can be reduced.

Figure 8:
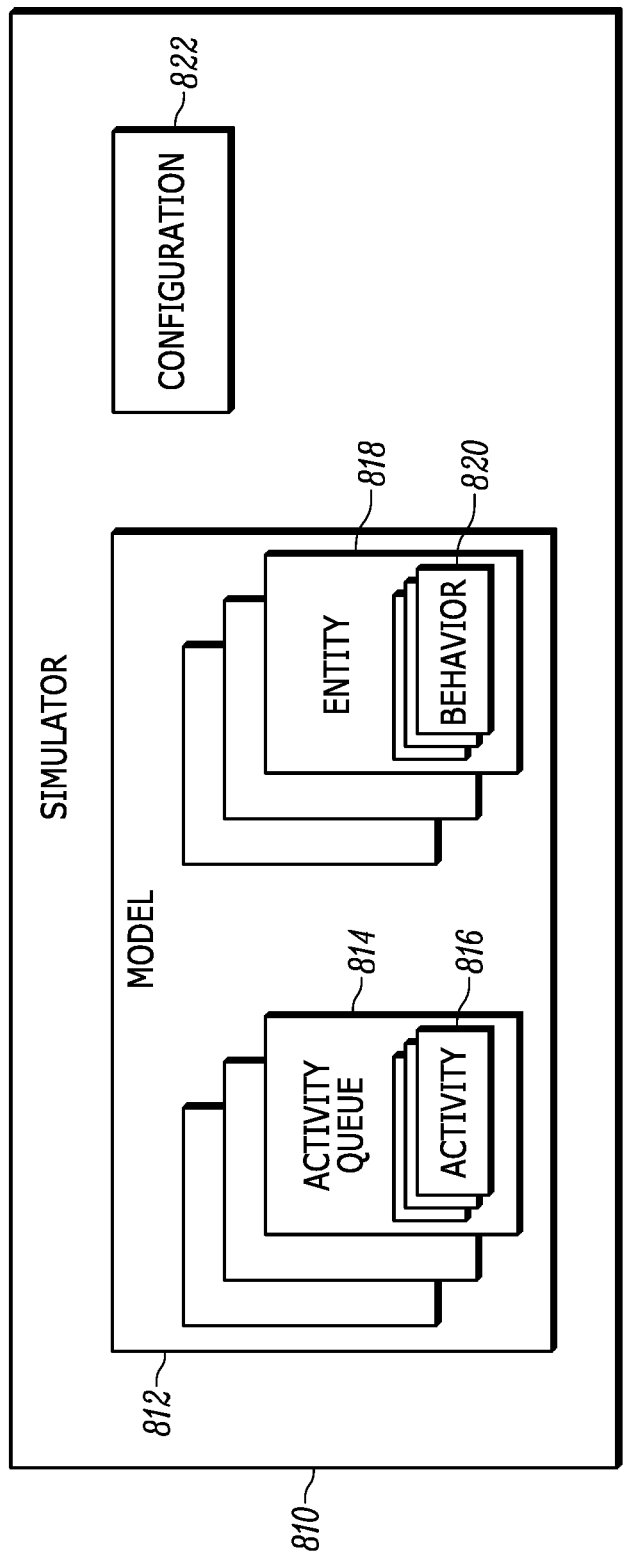
FIG. 8 is a block diagram of data objects processed by a simulator utilizing a system for coordinating behaviors in accordance with an embodiment of the present invention.

FIG. 8 is a block diagram of data objects processed by a simulator 810 utilizing a system for coordinating behaviors in accordance with an embodiment of the present invention. In an embodiment, the simulator takes a model 812 and a configuration 822. The model includes a plurality of activity queues 814 and each activity queue is configured to hold a plurality of activity instances 816, which can be held in an order (e.g., a numerical order, a temporal order, or a priority order). The model also includes a plurality of entities 818. In an embodiment, entities can be resource entities or custom entities and can be configured to have a plurality of behaviors 820.

Resource entities include, for example, a hospital bed, an elevator, or an x-ray machine. In an embodiment, resource entities are predetermined. Behaviors for resource entities alternate between available and in-use, as described in respect to FIG. 7 above. In an embodiment, resource entities join all available activities, but once all other participating entities have joined one of the available activities, the resource entity may leave all the other available activities and begin to perform its associated behavior. For example, if three patients are scheduled for an x-ray, then three x-ray activities can be created (e.g., one for each patient). The x-ray machine entity will immediately join all three x-ray activities, but will not advance to the "in-use" state of its behavior until all other entities have joined an available activity (e.g., the patient and an x-ray technician). Once all entities have joined an available activity and the activity begins, any resource entities in the activity may leave all other activities they have joined. For example, once a first patient joins his respective x-ray activity and an x-ray technician joins the x-ray activity, the x-ray machine will leave all other x-ray activities. Upon completion of the activity, the resource entities can rejoin all remaining activities.

Custom entities include, for example, patients, shoppers, guests, or other types of customers. In an embodiment, custom entities can be predefined or automatically generated to increase the randomness of the distribution, which results in a more accurate simulation. A custom entity can have more than one behavior and each behavior can be specified on a per-department basis such as an x-ray department, as described above with respect to FIG. 6. In an embodiment, a custom entity can join multiple activities at once or may only be able to join a single activity at a time. For example, in a hospital, a patient custom entity must first join a patient registration activity before it can join any other activity, but later, once a series of tests has been ordered, the patient custom entity can join activities for all of the scheduled tests just like a resource entity.

In an embodiment, schedules (not shown) can also be defined for entities. Thus, an entity will not join an activity outside of its hours of operation. For example, an x-ray machine can be defined with a schedule such that it will not join an x-ray activity outside of normal business hours (e.g., at midnight) even if an x-ray activity is available to join. In an embodiment, multiple schedules can be defined for an entity such as a weekday schedule and a weekend schedule or a work schedule and an appointment schedule, wherein the appointment schedule is a subset of the work schedule that indicates time slots at which appointments can be made (e.g., on the hour versus a random time like 11:43 am).

In an embodiment, activity instances are the primary coordination mechanism for the simulation and represent tasks in which an entity may participate. In an embodiment, an activity type can be defined for each activity to be performed in a model. Thus, for each activity there is a single activity type, but a model can include multiple instances of the activity.

An activity type can be defined by a participating entity type list and by a duration of time over which the activity will be performed. In an embodiment, the duration is defined as some finite period of time or, if the activity is on-going, as an indefinite period of time.

A model can be defined with an activity queue for each type of activity to be included in the model. For example, a model can have an activity queue for an x-ray activity and for a patient check-in activity. In an embodiment, instances of an activity type are queued in their corresponding queue (e.g., an instance of an x-ray activity type is queued in the x-ray activity queue, while an instance of a patient check-in activity type is queued in the patient check-in activity queue).

When an entity desires to or is able to participate in a task associated with an activity instance, the entity can "join" the associated activity instance. In an embodiment, an entity "joins" an activity instance in one of two ways. If there are no instances of the activity instance an entity wants to join in the corresponding activity queue or no instance of the activity instance an entity wants to join missing a participant of the entity's type, then a new instance of the activity type is created and added to the corresponding activity queue. The entity is then added to the participating entity list of the newly-created instance of the activity type. For example, if a queue for an x-ray activity instance has no x-ray activity instances or all x-ray activity instances already have a patient entity in the participating entity type list, then a new instance of an x-ray activity type is created and the patient is added to the participating entity type list.

Alternatively, if the queue corresponding to an activity the entity wants to join includes an instance and the instance in the queue still needs an entity of the entity's type, then the entity is added to the instance's participating entity type list.

In an embodiment, entities join activity instances in accordance with the following priorities: an entity will first filter for the oldest instance in an activity queue that needs only the entity in order for the activity instance to complete its entity type list, an entity will next filter for the oldest instance in the activity queue that still needs an entity of the entity's type, and finally, if an activity queue is empty and a new activity instance is created, as described above, an entity will join the newly created activity instance.

When an entity of each type in an activity instance's participating entity type list has joined the activity instance (e.g., the patient entity, the x-ray machine entity, and the x-ray technician entity), then the activity instance can start (e.g., the entities can being performing associated behaviors). As a result, the behaviors for the patient entity, x-ray machine entity, and x-ray technician entity are synchronized by the activity without the need for an external event scheduler or other external control mechanisms.

Figure 9:
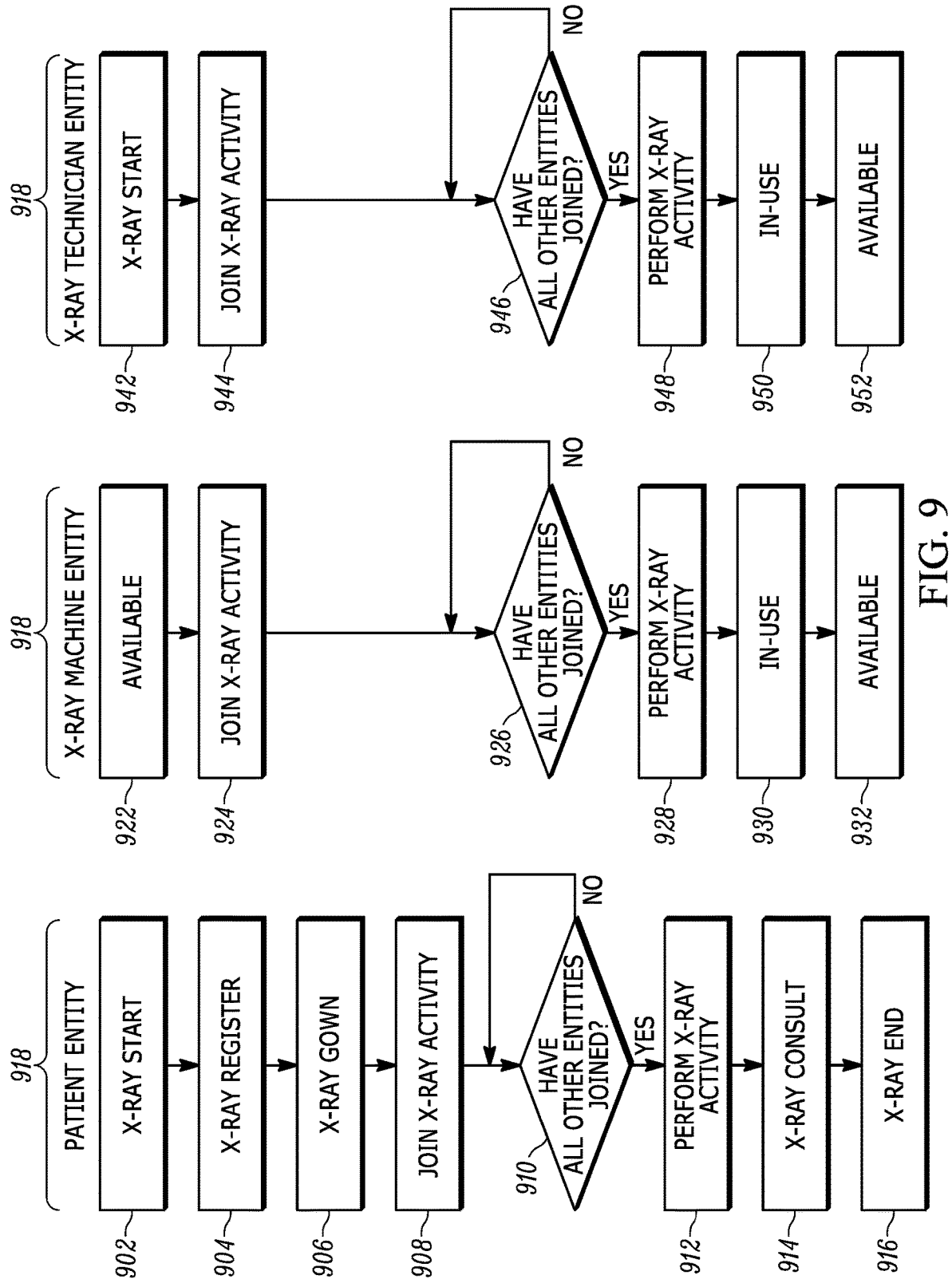
FIG. 9 is a flow chart diagram of coordinated behaviors in accordance with an embodiment of the invention.

FIG. 9 is a flow chart diagram of coordinated behaviors in accordance with an embodiment of the invention. As illustrated, the diagram shows coordinated behaviors 918 for a patient entity, an x-ray machine entity, and an x-ray technician. Beginning with the patient entity, the patient entity moves through each step of its behavior until it joins the x-ray activity at block 908. In an embodiment, each step (e.g., x-ray register) can also be an activity. Here, the steps are merely represented as behavior steps for simplicity of explanation. Once the patient entity joins the x-ray activity, at decision point 910, the patient entity waits until all other entities have joined the activity.

Meanwhile, at blocks 924 and 944, the x-ray machine entity and the x-ray technician entity join the x-ray activity as soon as they become available and, at decision points 926 and 946, wait until the patient entity joins the x-ray activity. As described above, if another x-ray activity becomes ready (e.g., all entities have joined the x-ray activity), then the x-ray machine entity and the x-ray technician entity may leave the x-ray activity.

Once the patient entity, the x-ray machine entity, and the x-ray technician entity have joined the x-ray activity, the x-ray activity can be performed. At the completion of the x-ray activity, each entity leaves the activity and enters the next state of their respective behaviors. For example, at block 914, the patient entity would enter x-ray consult after disgowning, while, at block 932, the x-ray machine entity would return to the available state and, at block 952, the x-ray technician entity would also return to the available state.

Thus, the activity synchronizes the behaviors of the patient entity, the x-ray machine entity, and the x-ray technician entity without external control by beginning performance of an activity only once all entities in an activity have joined, which affects entity behaviors accordingly.

Figure 10:
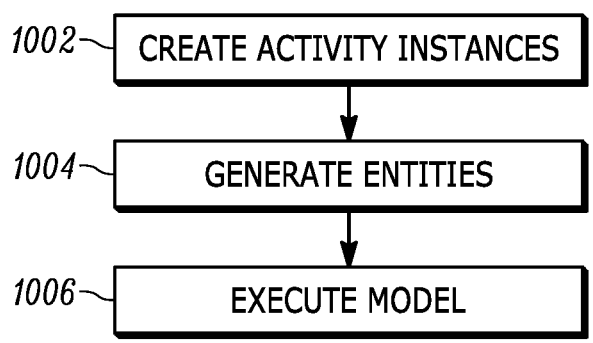
FIG. 10 is a flowchart diagram of a method for coordinating behaviors in accordance with an embodiment of the invention.

FIG. 10 is a flowchart diagram of a method for coordinating behaviors in accordance with an embodiment of the activity invention. At block 1002, instances of activities can be created. In an embodiment, the created instances are added to their corresponding activity queues. At block 1004, entities are generated. In an embodiment, generators are used to create one or more entities for simulation. In an embodiment, both resource entities and custom entities can be generated or predefined. In an embodiment, multiple types of generators can be used to increase distribution of entity types. For example, when simulating an airport, first class patron generators and coach class patron generators can be included to generate the two types of patrons. In an embodiment, generators have two parameters: a schedule and a distribution. Accordingly, the schedule determines the time range when new entities are to be created and the distribution determines the interval between the creation of each entity. For example, the schedule can be set to weekdays from 10 am-11 am and the distribution can be set to an interval of 10 minutes such that 6 patients are generated per weekday for 1,560 patients per year.

At block 1006, the model is executed. When the model is executed an entity joins an activity instance if the entity desires or is available to perform a task associated with the activity. If all entities that may join the activity have joined the activity, then the activity is performed. In an embodiment, upon completing performance of the activity, each entity that joined the activity leaves the activity and continues to transition through their respective behavior, as described above with reference to the patient entity, the x-ray machine entity, and the x-ray technician entity of FIG. 9.

Throughout the execution of the model, new activity instances are created and new entities are generated. The generated entities can join the activity instances and the activities can be performed. Thus, by joining an activity instance and waiting until all entities have joined the activity instance, behaviors of entities can be synchronized independent from external control.

Figure 11:
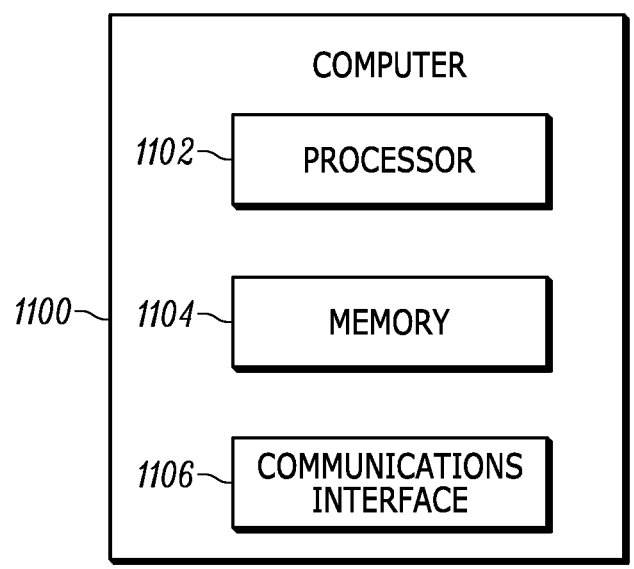
FIG. 11 depicts a computer that includes a processor, memory, and a communications interface.

In an embodiment, the above-described functionality is performed by a computer or computers, which executes computer readable instructions. FIG. 11 depicts a computer 1100 that includes a processor 1102, memory 1104, and a communications interface 1106. The processor may include a multifunction processor and/or an application-specific processor. Examples of processors include the PowerPC™ family of processors by IBM and the x86 family of processors by Intel such as the Xeon™ family of processors and the Intel X5650 processor. The memory within the computer may include, for example, a non-transitory computer-readable storage medium such as read only memory (ROM), flash memory, RAM, and a large capacity permanent storage device such as a hard disk drive. The communications interface enables communications with other computers via, for example, the Internet Protocol (IP). The computer executes computer readable instructions stored in the storage medium to implement various tasks as described above.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods may be implemented using software instructions stored on a computer useable storage medium for execution by a computer. As an example, an embodiment of a computer program product includes a computer useable storage medium to store a computer readable program that, when executed on a computer, causes the computer to perform operations, as described herein.

Furthermore, embodiments of at least portions of the invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

The computer-useable or computer-readable medium can be an electronic, magnetic, optical, electromagnetic, infrared, or semiconductor system (or apparatus or device), or a propagation medium. Examples of a computer-readable medium include a semiconductor or solid state memory, magnetic tape, a removable computer diskette, a random access memory (RAM), a read-only memory (ROM), a rigid magnetic disc, and an optical disc. Current examples of optical discs include a compact disc with read only memory (CD-ROM), a compact disc with read/write (CD-R/W), a digital video disc (DVD), and a Blu-ray disc.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A computer-based method for automatically selecting resources to include in a building plan layout, the method comprising:

obtaining a set of resource rules that define resources placeable within a building plan layout;

obtaining a set of behavioral rules that define the behaviors of the resources wherein obtaining the set of behavioral rules comprises obtaining a set of rules that defines states of state-machines of at least one of resources and entities, wherein a state-machine defines a set number of conditions or states and transitions between the conditions or states;

generating a model by evaluating the set of resource rules and the set of behavioral rules;

obtaining a configuration, wherein a configuration comprises at least one of building demand, resource permutations, and other simulation attributes;

generating at least one set of performance metrics by executing the model with the configuration;

storing the at least one set of performance metrics, the model, and the configuration as an entry in a metrics database;

selecting an entry from the metrics database;

outputting the entry to a building plan layout generator wherein generating at least one set of performance metrics by executing the model with the configuration comprises:

creating at least one activity instance, wherein the at least one activity instance has an activity type that defines a participating entity type list and a duration of time over which the activity instance will be performed;

generating at least one entity, wherein the at least one entity is associated with at least one behavior and is configured to join at least one activity instance; and executing a model including the at least one activity instance and the at least one entity using a configuration, wherein the model executes by:

generating at least one activity queue, wherein the at least one activity queue is configured to hold the at least one activity instance;

adding the at least one activity instance to the activity queue; and upon joining of an entity of each type in the participating entity type list of the at least one activity instance, triggering performance of the at least one behavior associated with each entity that has joined the at least one activity instance.

2. The computer-based method of claim 1, wherein obtaining the set of resource rules comprises obtaining a set of rules that define at least resource characteristics regarding properties of individual resources.

3. The computer-based method of claim 1, wherein generating a model comprises generating a plurality of models.

4. The computer-based method of claim 3, wherein generating at least one set of performance metrics further comprises executing one or more models in the plurality of models with the configuration.

5. The computer-based method of claim 1, wherein obtaining a configuration comprises obtaining a plurality of configurations.

6. The computer-based method of claim 5, wherein generating at least one set of performance metrics further comprises executing the model for one or more configurations in the plurality of configurations.

7. The computer-based method of claim 1, wherein selecting an entry from the metrics database comprises filtering entries in the metrics database that violate a resource rule.

8. The computer-based method of claim 1, the method further comprising:

generating a space program based on the selected entry;
placing departments within the building plan layout based on the space program;
placing rooms in the space program in the departments;
placing content in the selected entry in the rooms; and
outputting the building plan layout.

9. The computer-based method of claim 8, wherein placing is performed by a constraint solver.

10. A computer-implemented system for automatically selecting resources to include in a building plan layout, wherein the system is configured to:

obtain a set of resource rules that define resources placeable within a building plan layout;
obtain a set of behavioral rules that define the behaviors of the resources, wherein obtaining the set of behavioral rules comprises obtaining a set of rules that defines states of state-machines of at least one of resources and entities, wherein a state-machine defines a set number of conditions or states and transitions between the conditions or states;

generate a model by evaluating the set of resource rules and the set of behavioral rules;

obtain a configuration, wherein a configuration comprises at least one of building demand, resource permutations, and other simulation attributes;

generate at least one set of performance metrics by executing the model with the configuration;

store the at least one set of performance metrics, the model, and the configuration as an entry in a metrics database;

select an entry from the metrics database;

output the entry to a building plan layout generator wherein generating at least one set of performance metrics by executing the model with the configuration comprises:

creating at least one activity instance, wherein the at least one activity instance has an activity type that defines a participating entity type list and a duration of time over which the activity instance will be performed;

generating at least one entity, wherein the at least one entity is associated with at least one behavior and is configured to join at least one activity instance; and executing a model including the at least one activity instance and the at least one entity using a configuration, wherein the model executes by:

generating at least one activity queue, wherein the at least one activity queue is configured to hold the at least one activity instance;

adding the at least one activity instance to the activity queue; and upon joining of an entity of each type in the participating entity type list of the at least one activity instance, triggering performance of the at least one behavior associated with each entity that has joined the at least one activity instance.

11. The computer-implemented system of claim 10, wherein the system is configured to obtain the set of resource rules by obtaining a set of rules that define at least resource characteristics regarding properties of individual resources.

12. The computer-implemented system of claim 10, wherein the system is configured to generate a plurality of models when generating a model.

13. The computer-implemented system of claim 12, wherein the system is further configured to generate at least one set of performance metrics by executing one or more models in the plurality of models with the configuration.

14. The computer-implemented system of claim 10, wherein the system is configured to obtain a configuration by obtaining a plurality of configurations.

15. The computer-implemented system of claim 14, wherein the system is further configured to generate at least one set of performance metrics by executing the model for one or more configurations in the plurality of configurations.

16. The computer-implemented system of claim 10, wherein the system is configured to select an entry from the metrics database by filtering entries in the metrics database that violate a resource rule.

17. The computer-implemented system of claim 10, wherein the system is further configured to:

generate a space program based on the selected entry;
place departments within the building plan layout based on the space program;

place rooms in the space program in the departments;
place content in the selected entry in the rooms; and
output the building plan layout.

18. The computer-implemented system of claim 17, wherein the system is configured to place the departments, rooms, and content using a constraint solver.

* * * * *